US008871305B2

(12) United States Patent
Lee

(10) Patent No.: US 8,871,305 B2
(45) Date of Patent: Oct. 28, 2014

(54) METHODS FOR INFUSING ONE OR MORE MATERIALS INTO NANO-VOIDS OF NANOPOROUS OR NANOSTRUCTURED MATERIALS

(75) Inventor: Howard W. H. Lee, Saratoga, CA (US)

(73) Assignee: Stion Corporation, San Jose, CA (US)

( * ) Notice: Subject to any disclaimer, the term of this patent is extended or adjusted under 35 U.S.C. 154(b) by 203 days.

(21) Appl. No.: 13/286,654

(22) Filed: Nov. 1, 2011

(65) Prior Publication Data

US 2012/0045886 A1 Feb. 23, 2012

Related U.S. Application Data

(62) Division of application No. 12/163,416, filed on Jun. 27, 2008, now Pat. No. 8,071,179.

(60) Provisional application No. 60/947,326, filed on Jun. 29, 2007.

(51) Int. Cl.
*B05D 3/00* (2006.01)
*B05D 7/22* (2006.01)

(52) U.S. Cl.
USPC ........... 427/294; 427/295; 427/238; 427/532; 427/398.4

(58) Field of Classification Search
USPC ......... 427/180, 181, 226, 229, 238, 294, 295, 427/398.1, 398.4, 532
See application file for complete search history.

(56) References Cited

U.S. PATENT DOCUMENTS

| 3,520,732 | A | 7/1970 | Nakayama et al. |
| 3,828,722 | A | 8/1974 | Reuter et al. |
| 3,975,211 | A | 8/1976 | Shirland |
| 4,062,038 | A | 12/1977 | Cuomo et al. |
| 4,204,933 | A | 5/1980 | Barlow et al. |
| 4,213,781 | A | 7/1980 | Noreika et al. |
| 4,239,553 | A | 12/1980 | Barnett et al. |
| 4,263,336 | A | 4/1981 | Thompson et al. |
| 4,332,974 | A | 6/1982 | Fraas |
| 4,335,266 | A | 6/1982 | Mickelsen et al. |

(Continued)

FOREIGN PATENT DOCUMENTS

| AU | 1998/78651 | 2/1999 |
| AU | 2001/40599 A1 | 8/2001 |

(Continued)

OTHER PUBLICATIONS

Baumann, A., et al., Photovoltaic Technology Review, presentation Dec. 6, 2004, 18 pages.

(Continued)

*Primary Examiner* — Michael Wieczorek
(74) *Attorney, Agent, or Firm* — Kilpatrick Townsend & Stockton LLP

(57) ABSTRACT

A method of forming composite nanostructures using one or more nanomaterials. The method provides a nanostructure material having a surface region and one or more nano void regions within a first thickness in the surface region. The method subjects the surface region of the nanostructure material with a fluid. An external energy is applied to the fluid and/or the nanostructure material to drive in a portion of the fluid into one or more of the void regions and cause the one or more nano void regions to be substantially filled with the fluid and free from air gaps.

10 Claims, 6 Drawing Sheets

(56) References Cited

U.S. PATENT DOCUMENTS

| | | | |
|---|---|---|---|
| 4,441,113 A | 4/1984 | Madan | |
| 4,442,310 A | 4/1984 | Carlson et al. | |
| 4,461,922 A | 7/1984 | Gay et al. | |
| 4,465,575 A | 8/1984 | Love et al. | |
| 4,471,155 A | 9/1984 | Mohr et al. | |
| 4,499,658 A | 2/1985 | Lewis | |
| 4,502,225 A | 3/1985 | Lin | |
| 4,507,181 A | 3/1985 | Nath et al. | |
| 4,517,403 A | 5/1985 | Morel et al. | |
| 4,518,855 A | 5/1985 | Malak | |
| 4,542,255 A | 9/1985 | Tanner et al. | |
| 4,581,108 A | 4/1986 | Kapur et al. | |
| 4,589,194 A | 5/1986 | Roy | |
| 4,598,306 A | 7/1986 | Nath et al. | |
| 4,599,154 A | 7/1986 | Bender et al. | |
| 4,611,091 A | 9/1986 | Choudary et al. | |
| 4,612,411 A | 9/1986 | Wieting et al. | |
| 4,623,601 A | 11/1986 | Lewis et al. | |
| 4,625,070 A | 11/1986 | Berman et al. | |
| 4,638,111 A | 1/1987 | Gay | |
| 4,661,370 A | 4/1987 | Tarrant | |
| 4,663,495 A | 5/1987 | Berman et al. | |
| 4,705,912 A | 11/1987 | Nakashima et al. | |
| 4,724,011 A | 2/1988 | Turner et al. | |
| 4,727,047 A | 2/1988 | Bozler et al. | |
| 4,751,149 A | 6/1988 | Vijayakumar et al. | |
| 4,775,425 A | 10/1988 | Guha et al. | |
| 4,793,283 A | 12/1988 | Sarkozy | |
| 4,798,660 A | 1/1989 | Ermer et al. | |
| 4,816,082 A | 3/1989 | Guha et al. | |
| 4,816,420 A | 3/1989 | Bozler et al. | |
| 4,865,999 A | 9/1989 | Xi et al. | |
| 4,873,118 A | 10/1989 | Elias et al. | |
| 4,915,745 A | 4/1990 | Pollock et al. | |
| 4,950,615 A | 8/1990 | Basol et al. | |
| 4,968,354 A | 11/1990 | Nishiura et al. | |
| 4,996,108 A | 2/1991 | Divigalpitiya et al. | |
| 5,008,062 A | 4/1991 | Anderson et al. | |
| 5,011,565 A | 4/1991 | Dube et al. | |
| 5,028,274 A | 7/1991 | Basol et al. | |
| 5,039,353 A | 8/1991 | Schmitt | |
| 5,045,409 A | 9/1991 | Eberspacher et al. | |
| 5,069,727 A | 12/1991 | Kouzuma et al. | |
| 5,078,803 A | 1/1992 | Pier et al. | |
| 5,125,984 A | 6/1992 | Kruehler et al. | |
| 5,133,809 A | 7/1992 | Sichanugrist et al. | |
| 5,137,835 A | 8/1992 | Karg | |
| 5,154,777 A | 10/1992 | Blackmom et al. | |
| 5,180,686 A | 1/1993 | Banerjee et al. | |
| 5,211,824 A | 5/1993 | Knapp | |
| 5,217,564 A | 6/1993 | Bozler et al. | |
| 5,231,047 A | 7/1993 | Ovshinsky et al. | |
| 5,248,345 A | 9/1993 | Sichanugrist et al. | |
| 5,259,883 A | 11/1993 | Yamabe et al. | |
| 5,261,968 A | 11/1993 | Jordan | |
| 5,298,086 A | 3/1994 | Guha et al. | |
| 5,336,381 A * | 8/1994 | Dalzell et al. | 204/491 |
| 5,336,623 A | 8/1994 | Sichanugrist et al. | |
| 5,346,853 A | 9/1994 | Guha et al. | |
| 5,399,504 A | 3/1995 | Ohsawa | |
| 5,421,909 A | 6/1995 | Ishikawa et al. | |
| 5,436,204 A | 7/1995 | Albin et al. | |
| 5,445,847 A | 8/1995 | Wada | |
| 5,474,939 A | 12/1995 | Pollock et al. | |
| 5,482,571 A | 1/1996 | Yamada et al. | |
| 5,501,744 A | 3/1996 | Albright et al. | |
| 5,512,107 A | 4/1996 | van den Berg | |
| 5,528,397 A | 6/1996 | Zavracky et al. | |
| 5,536,333 A | 7/1996 | Foote et al. | |
| 5,578,103 A | 11/1996 | Araujo et al. | |
| 5,578,503 A | 11/1996 | Karg et al. | |
| 5,589,006 A | 12/1996 | Itoyama et al. | |
| 5,622,634 A | 4/1997 | Noma et al. | |
| 5,626,688 A | 5/1997 | Probst et al. | |
| 5,665,175 A | 9/1997 | Safir | |
| 5,676,766 A | 10/1997 | Probst et al. | |
| 5,698,496 A * | 12/1997 | Fastnacht et al. | 505/470 |
| 5,726,065 A | 3/1998 | Szlufcik et al. | |
| 5,738,731 A | 4/1998 | Shindo et al. | |
| 5,858,819 A | 1/1999 | Miyasaka | |
| 5,868,869 A | 2/1999 | Albright et al. | |
| 5,925,228 A * | 7/1999 | Panitz et al. | 204/484 |
| 5,948,176 A | 9/1999 | Ramanathan et al. | |
| 5,977,476 A | 11/1999 | Guha et al. | |
| 5,981,868 A | 11/1999 | Kushiya et al. | |
| 5,985,691 A | 11/1999 | Basol et al. | |
| 6,001,744 A | 12/1999 | Doi | |
| 6,027,795 A * | 2/2000 | Kabra et al. | 428/305.5 |
| 6,040,521 A | 3/2000 | Kushiya et al. | |
| 6,048,442 A | 4/2000 | Kushiya et al. | |
| 6,077,722 A | 6/2000 | Jansen et al. | |
| 6,092,669 A | 7/2000 | Kushiya et al. | |
| 6,107,562 A | 8/2000 | Hashimoto et al. | |
| 6,127,202 A | 10/2000 | Kapur et al. | |
| 6,134,049 A | 10/2000 | Spiller et al. | |
| 6,160,215 A | 12/2000 | Curtin | |
| 6,166,319 A | 12/2000 | Matsuyama | |
| 6,169,246 B1 | 1/2001 | Wu et al. | |
| 6,172,297 B1 | 1/2001 | Hezel et al. | |
| 6,258,620 B1 | 7/2001 | Morel et al. | |
| 6,288,325 B1 | 9/2001 | Jansen et al. | |
| 6,294,274 B1 | 9/2001 | Kawazoe et al. | |
| 6,307,148 B1 | 10/2001 | Takeuchi et al. | |
| 6,310,281 B1 | 10/2001 | Wendt et al. | |
| 6,323,417 B1 | 11/2001 | Gillespie et al. | |
| 6,328,871 B1 | 12/2001 | Ding et al. | |
| RE37,512 E | 1/2002 | Szlufcik et al. | |
| 6,361,718 B1 | 3/2002 | Shinmo et al. | |
| 6,372,538 B1 | 4/2002 | Wendt et al. | |
| 6,380,480 B1 | 4/2002 | Norimatsu et al. | |
| 6,423,565 B1 | 7/2002 | Barth et al. | |
| 6,537,845 B1 | 3/2003 | McCandless et al. | |
| 6,632,113 B1 | 10/2003 | Noma et al. | |
| 6,635,307 B2 | 10/2003 | Huang et al. | |
| 6,653,701 B1 | 11/2003 | Yamazaki et al. | |
| 6,667,492 B1 | 12/2003 | Kendall | |
| 6,690,041 B2 | 2/2004 | Armstrong et al. | |
| 6,692,820 B2 | 2/2004 | Forrest et al. | |
| 6,784,492 B1 | 8/2004 | Morishita | |
| 6,852,920 B2 | 2/2005 | Sager et al. | |
| 6,863,924 B2 * | 3/2005 | Ranganathan et al. | 427/243 |
| 6,878,871 B2 | 4/2005 | Scher et al. | |
| 6,974,976 B2 | 12/2005 | Hollars | |
| 7,122,398 B1 | 10/2006 | Pichler | |
| 7,179,677 B2 | 2/2007 | Ramanathan et al. | |
| 7,194,197 B1 | 3/2007 | Wendt et al. | |
| 7,220,321 B2 | 5/2007 | Barth et al. | |
| 7,235,736 B1 | 6/2007 | Buller et al. | |
| 7,252,923 B2 | 8/2007 | Kobayashi | |
| 7,265,037 B2 | 9/2007 | Yang et al. | |
| 7,303,788 B2 | 12/2007 | Kataokaet et al. | |
| 7,319,190 B2 | 1/2008 | Tuttle | |
| 7,364,808 B2 | 4/2008 | Sato et al. | |
| 7,441,413 B2 | 10/2008 | Bae et al. | |
| 7,442,413 B2 | 10/2008 | Zwaap et al. | |
| 7,544,884 B2 | 6/2009 | Hollars | |
| 7,576,017 B2 | 8/2009 | Tuttle | |
| 7,736,755 B2 | 6/2010 | Igarashi et al. | |
| 7,741,560 B2 | 6/2010 | Yonezawa | |
| 7,846,750 B2 | 12/2010 | Boyer | |
| 7,855,089 B2 | 12/2010 | Farris, III et al. | |
| 7,863,074 B2 | 1/2011 | Wieting | |
| 7,863,518 B2 | 1/2011 | Terakawa et al. | |
| 7,875,945 B2 | 1/2011 | Krasnov et al. | |
| 7,910,399 B1 | 3/2011 | Wieting | |
| 7,955,891 B2 | 6/2011 | Wieting | |
| 7,960,204 B2 | 6/2011 | Lee | |
| 7,993,954 B2 | 8/2011 | Wieting | |
| 7,993,955 B2 | 8/2011 | Wieting | |
| 7,998,762 B1 | 8/2011 | Lee et al. | |
| 8,003,430 B1 | 8/2011 | Lee | |
| 8,008,110 B1 | 8/2011 | Lee | |
| 8,008,111 B1 | 8/2011 | Lee | |
| 8,008,112 B1 | 8/2011 | Lee | |

(56) References Cited

U.S. PATENT DOCUMENTS

| | | |
|---|---|---|
| 8,017,860 B2 | 9/2011 | Lee |
| 8,026,122 B1 | 9/2011 | Lee |
| 8,142,521 B2 | 3/2012 | Wieting |
| 8,168,463 B2 | 5/2012 | Wieting |
| 8,178,370 B2 | 5/2012 | Lee et al. |
| 8,183,066 B2 | 5/2012 | Lee et al. |
| 8,217,261 B2 | 7/2012 | Wieting |
| 8,263,494 B2 | 9/2012 | Patterson |
| 8,287,942 B1 | 10/2012 | Huang et al. |
| 2002/0002992 A1 | 1/2002 | Kariya et al. |
| 2002/0004302 A1 | 1/2002 | Fukumoto et al. |
| 2002/0061361 A1 | 5/2002 | Nakahara et al. |
| 2002/0063065 A1 | 5/2002 | Sonoda et al. |
| 2003/0075717 A1 | 4/2003 | Kondo et al. |
| 2003/0089899 A1 | 5/2003 | Lieber et al. |
| 2003/0188777 A1 | 10/2003 | Gaudiana et al. |
| 2003/0230338 A1 | 12/2003 | Menezes |
| 2004/0063320 A1 | 4/2004 | Hollars |
| 2004/0084080 A1 | 5/2004 | Sager et al. |
| 2004/0095658 A1 | 5/2004 | Buretea et al. |
| 2004/0110393 A1 | 6/2004 | Munzer et al. |
| 2004/0161539 A1* | 8/2004 | Miyakawa ............... 427/376.2 |
| 2004/0187917 A1 | 9/2004 | Pichler |
| 2004/0191949 A1 | 9/2004 | Iwata et al. |
| 2004/0191950 A1 | 9/2004 | Nakamura et al. |
| 2004/0245912 A1 | 12/2004 | Thurk et al. |
| 2004/0252488 A1 | 12/2004 | Thurk |
| 2004/0256001 A1 | 12/2004 | Mitra et al. |
| 2005/0074915 A1 | 4/2005 | Tuttle et al. |
| 2005/0109392 A1 | 5/2005 | Hollars |
| 2005/0164432 A1 | 7/2005 | Lieber et al. |
| 2005/0194036 A1 | 9/2005 | Basol |
| 2005/0223570 A1 | 10/2005 | Yonezawa et al. |
| 2005/0287717 A1 | 12/2005 | Heald et al. |
| 2006/0034065 A1 | 2/2006 | Thurk |
| 2006/0040103 A1 | 2/2006 | Whiteford et al. |
| 2006/0051505 A1 | 3/2006 | Kortshagen et al. |
| 2006/0096536 A1 | 5/2006 | Tuttle |
| 2006/0096537 A1 | 5/2006 | Tuttle |
| 2006/0096635 A1 | 5/2006 | Tuttle |
| 2006/0102230 A1 | 5/2006 | Tuttle |
| 2006/0112983 A1 | 6/2006 | Parce et al. |
| 2006/0160261 A1 | 7/2006 | Sheats et al. |
| 2006/0173113 A1 | 8/2006 | Yabuta et al. |
| 2006/0174932 A1 | 8/2006 | Usui et al. |
| 2006/0219288 A1 | 10/2006 | Tuttle |
| 2006/0219547 A1 | 10/2006 | Tuttle |
| 2006/0220059 A1 | 10/2006 | Satoh et al. |
| 2006/0249202 A1 | 11/2006 | Yoo et al. |
| 2006/0267054 A1 | 11/2006 | Martin et al. |
| 2007/0004078 A1 | 1/2007 | Alberts |
| 2007/0006914 A1 | 1/2007 | Lee |
| 2007/0089782 A1 | 4/2007 | Scheuten et al. |
| 2007/0116892 A1 | 5/2007 | Zwaap et al. |
| 2007/0116893 A1 | 5/2007 | Zwaap |
| 2007/0151596 A1 | 7/2007 | Nasuno et al. |
| 2007/0163643 A1 | 7/2007 | Van Duren et al. |
| 2007/0169810 A1 | 7/2007 | Van Duren et al. |
| 2007/0193623 A1 | 8/2007 | Krasnov |
| 2007/0209700 A1 | 9/2007 | Yonezawa et al. |
| 2007/0243657 A1 | 10/2007 | Basol et al. |
| 2007/0264488 A1 | 11/2007 | Lee |
| 2007/0283998 A1 | 12/2007 | Kuriyagawa et al. |
| 2007/0289624 A1 | 12/2007 | Kuriyagawa et al. |
| 2008/0029154 A1 | 2/2008 | Mishtein et al. |
| 2008/0032044 A1 | 2/2008 | Kuriyagawa et al. |
| 2008/0041446 A1 | 2/2008 | Wu et al. |
| 2008/0057616 A1 | 3/2008 | Robinson et al. |
| 2008/0092945 A1 | 4/2008 | Munteanu et al. |
| 2008/0092953 A1 | 4/2008 | Lee |
| 2008/0092954 A1 | 4/2008 | Choi |
| 2008/0105294 A1 | 5/2008 | Kushiya et al. |
| 2008/0110495 A1 | 5/2008 | Onodera et al. |
| 2008/0115827 A1 | 5/2008 | Woods et al. |
| 2008/0121264 A1 | 5/2008 | Chen et al. |
| 2008/0121277 A1 | 5/2008 | Robinson et al. |
| 2008/0204696 A1 | 8/2008 | Kamijima |
| 2008/0210303 A1 | 9/2008 | Lu et al. |
| 2008/0216886 A1 | 9/2008 | Iwakura |
| 2008/0280030 A1 | 11/2008 | Van Duren et al. |
| 2008/0283389 A1 | 11/2008 | Aoki |
| 2009/0021157 A1 | 1/2009 | Kim et al. |
| 2009/0058295 A1 | 3/2009 | Auday et al. |
| 2009/0084438 A1 | 4/2009 | den Boer et al. |
| 2009/0087940 A1 | 4/2009 | Kushiya |
| 2009/0087942 A1 | 4/2009 | Meyers |
| 2009/0145746 A1 | 6/2009 | Hollars |
| 2009/0217969 A1 | 9/2009 | Matsushima et al. |
| 2009/0234987 A1 | 9/2009 | Lee et al. |
| 2009/0235983 A1 | 9/2009 | Girt et al. |
| 2009/0235987 A1 | 9/2009 | Akhtar et al. |
| 2009/0293945 A1 | 12/2009 | Peter |
| 2010/0081230 A1 | 4/2010 | Lee |
| 2010/0087016 A1 | 4/2010 | Britt et al. |
| 2010/0087026 A1 | 4/2010 | Winkeler et al. |
| 2010/0087027 A1 | 4/2010 | Wieting |
| 2010/0096007 A1 | 4/2010 | Mattmann et al. |
| 2010/0101648 A1 | 4/2010 | Morooka et al. |
| 2010/0101649 A1 | 4/2010 | Huignard et al. |
| 2010/0122726 A1 | 5/2010 | Lee |
| 2010/0197051 A1 | 8/2010 | Schlezinger et al. |
| 2010/0210064 A1 | 8/2010 | Hakuma et al. |
| 2010/0224247 A1 | 9/2010 | Bartholomeusz et al. |
| 2010/0233386 A1 | 9/2010 | Krause et al. |
| 2010/0258179 A1 | 10/2010 | Wieting |
| 2010/0267189 A1 | 10/2010 | Yu et al. |
| 2010/0267190 A1 | 10/2010 | Hakuma et al. |
| 2010/0297798 A1 | 11/2010 | Adriani et al. |
| 2011/0018103 A1 | 1/2011 | Wieting |
| 2011/0020980 A1 | 1/2011 | Wieting |
| 2011/0070682 A1 | 3/2011 | Wieting |
| 2011/0070683 A1 | 3/2011 | Wieting |
| 2011/0070684 A1 | 3/2011 | Wieting |
| 2011/0070685 A1 | 3/2011 | Wieting |
| 2011/0070686 A1 | 3/2011 | Wieting |
| 2011/0070687 A1 | 3/2011 | Wieting |
| 2011/0070688 A1 | 3/2011 | Wieting |
| 2011/0070689 A1 | 3/2011 | Wieting |
| 2011/0070690 A1 | 3/2011 | Wieting |
| 2011/0071659 A1 | 3/2011 | Farris, III et al. |
| 2011/0073181 A1 | 3/2011 | Wieting |
| 2011/0203634 A1 | 8/2011 | Wieting |
| 2011/0212565 A1 | 9/2011 | Wieting |
| 2011/0259395 A1 | 10/2011 | Wieting et al. |
| 2011/0259413 A1 | 10/2011 | Wieting et al. |
| 2011/0269260 A1 | 11/2011 | Buquing |
| 2011/0277836 A1 | 11/2011 | Lee |
| 2012/0003789 A1 | 1/2012 | Doering et al. |
| 2012/0021552 A1 | 1/2012 | Alexander et al. |
| 2012/0094432 A1 | 4/2012 | Wieting |
| 2012/0122304 A1 | 5/2012 | Wieting |
| 2012/0186975 A1 | 7/2012 | Lee et al. |
| 2012/0240989 A1 | 9/2012 | Ramanathan et al. |
| 2012/0270341 A1 | 10/2012 | Lee et al. |

FOREIGN PATENT DOCUMENTS

| | | |
|---|---|---|
| DE | 3314197 A1 | 11/1983 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2002/299670 | 10/2002 |
| JP | 2004/332043 | 11/2004 |
| JP | 2005/311292 | 11/2005 |
| WO | 01/57932 A1 | 8/2001 |
| WO | 2005/011002 | 2/2005 |
| WO | 2006/126598 A1 | 11/2006 |

(56) References Cited

FOREIGN PATENT DOCUMENTS

| | | |
|---|---|---|
| WO | 2007/022221 A2 | 2/2007 |
| WO | 2007/077171 A2 | 7/2007 |
| WO | 2008/025326 A2 | 3/2008 |

OTHER PUBLICATIONS

Chopra et al., "Thin-Film Solar Cells: An Overview", 2004, Progress in Photovoltaics: Research and Applications, 2004, vol. 12, pp. 69-92.

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

Guillen C., "$CuInS_2$ Thin Films Grown Sequentially from Binary Sulfides as Compared to Layers Evaporated Directly from the Elements", Semiconductor Science and Technology, vol. 21, No. 5, May 2006, pp. 709-712.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of $Zn_xCd_{1-x}S$ Nanocomposites in Polymer Matrices and their Photophysical Properties, Langmuir 1998, 14, pp. 4342-4344.

International Solar Electric Technology, Inc. (ISET) "Thin Film CIGS", Retrieved from http://www.isetinc.com/cigs.html on Oct. 1, 2008, 4 pages.

Kapur et al., "Fabrication of CIGS Solar Cells via Printing of Nanoparticle Precursor Inks", DOE Solar Program Review Meeting 2004, DOE/GO-102005-2067, p. 135-136.

Kapur et al., "Non-Vacuum Printing Process for CIGS Solar Cells on Rigid and Flexible Substrates", 29th IEEE Photovoltaic Specialists Conf., New Orleans, LA, IEEE, 2002, pp. 688-691.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43, 2003.

Kapur et al., "Non-Vacuum Processing of $CuIn_{1-x}Ga_xSe_2$ Solar Cells on Rigid and Flexible Substrates using Nanoparticle Precursor Inks", Thin Solid Films, 2003, vol. 431-432, pp. 53-57.

Kapur et al., "Fabrication of Light Weight Flexible CIGS Solar Cells for Space Power Applications", Materials Research Society, Proceedings vol. 668, (2001) ppH3.5.1-H3.5.6.

Kapur et al., "Nanoparticle Oxides Precursor Inks for Thin Film Copper Indium Gallium Selenide (CIGS) Solar Cells", Materials Research Society Proceedings, vol. 668, (2001) pp. H2.6.1-H2.6.7.

Mehta et al., "A graded diameter and oriented nanorod-thin film structure for solar cell application: a device proposal", Solar Energy Materials & Solar Cells, 2005, vol. 85, pp. 107-113.

Onuma et al., Preparation and Characterization of $CuInS_2$ Thin Films Solar Cells with Large Grain, Elsevier Science B.V; Solar Energy Materials & Solar Cells 69 (2001) pp. 261-269.

Salvador, "Hole diffusion length in $n$-$TiO_2$ single crystals and sintered electrodes: photoelectrochemical determination and comparative analysis," Journal of Applied Physics, vol. 55, No. 8, pp. 2977-2985, Apr. 15, 1984.

Srikant V., et al., "On the Optical Band Gap of Zinc Oxide", Journal of Applied Physics, vol. 83, No. 10, May 15, 1998, pp. 5447-5451.

Yang et al., "Preparation, Characterization and Electroluminescence of ZnS Nanocrystals in a Polymer Matrix", Journal Material Chem., 1997, vol. 7, No. 1, pp. 131-133.

Yang et al., "Electroluminescence from ZnS/CdS Nanocrystals/Polymer Composite", Synthetic Metals 1997, vol. 91, pp. 347-349.

Yang et al., "Fabrication and Characteristics of ZnS Nanocrystals/ Polymer Composite Doped with Tetraphenylbenzidine Single Layer Structure Light-emitting Diode", Applied Physics Letters, vol. 69, No. 3, Jul. 15, 1996, pp. 377-379.

\* cited by examiner

METHODS FOR INFUSING ONE OR MORE MATERIALS INTO NANO-VOIDS OF NANOPOROUS OR NANOSTRUCTURED MATERIALS

CROSS-REFERENCES TO RELATED APPLICATIONS

This application is a division of and claims priority to U.S. patent application Ser. No. 12/163,416, filed on Jun. 27, 2008, which claims priority to U.S. Provisional Patent Application No. 60/947,326, filed Jun. 29, 2007, entitled "METHODS FOR INFUSING ONE OR MORE MATERIALS INTO NANO-VOIDS OF NANOPOROUS OR NANOSTRUCTURED MATERIALS", the disclosures of both the applications are incorporated by reference herein in their entirety for all purposes.

BACKGROUND OF THE INVENTION

The present invention relates generally to photovoltaic materials. More particularly, the present invention provides a method and structure for manufacture of photovoltaic materials using a thin film process including Group IV materials (e.g., silicon, germanium) and metal oxides, such as copper oxide and the like. Merely by way of example, the present method and structure have been implemented using a nanostructure configuration, but it would be recognized that the invention may have other configurations.

From the beginning of time, human beings have been challenged to find ways of harnessing energy. Energy comes in the forms such as petrochemical, hydroelectric, nuclear, wind, biomass, solar, and more primitive forms such as wood and coal. Over the past century, modern civilization has relied upon petrochemical energy as an important source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, petrochemical energy is limited and essentially fixed based upon the amount available on the planet Earth. Additionally, as more human beings begin to drive and use petrochemicals, it is becoming a rather scarce resource, which will eventually run out over time.

More recently, clean sources of energy have been desired. An example of a clean source of energy is hydroelectric power. Hydroelectric power is derived from electric generators driven by the force of water that has been held back by large dams such as the Hoover Dam in Nevada. The electric power generated is used to power up a large portion of Los Angeles, Calif. Clean sources of energy also include wind, waves, and the like. That is, large windmills often convert wind into more useful forms of energy such as electricity. Still other types of clean energy include solar energy. Specific details of solar energy can be found throughout the present background and more particularly below.

Solar energy generally converts electromagnetic radiation from our sun to other useful forms of energy. These other forms of energy include thermal energy and electrical power. For electrical power applications, solar cells are often used. Although solar energy is clean and has been successful to a point, there are still many limitations before it becomes widely used throughout the world. As an example, one type of solar cell uses crystalline materials, which form from semiconductor material ingots. These crystalline materials include photo-diode devices that convert electromagnetic radiation into electrical current. Crystalline materials are often costly and difficult to make on a wide scale. Additionally, devices made from such crystalline materials have low energy conversion efficiencies. Other types of solar cells use "thin film" technology to form a thin film of photosensitive material to be used to convert electromagnetic radiation into electrical current. Similar limitations exist with the use of thin film technology in making solar cells. That is, efficiencies are often poor. Additionally, film reliability is often poor and cannot be used for extensive periods of time in conventional environmental applications. Often time, thin films are difficult to mechanically integrate with each other. These and other limitations of these conventional technologies can be found throughout the present specification and more particularly below.

From the above, it is seen that improved techniques for manufacturing photovoltaic materials and resulting devices are desired.

BRIEF SUMMARY OF THE INVENTION

According to embodiments of the present invention, techniques related to nanostructure materials are provided. More particularly, embodiments according to the present invention provides a method and structure for forming composite nanostructure using a nanostructure material and driving a fluid into nano voids regions of the nanostructure material. Merely by way of example, the present method and structure have been implemented using a nanostructure configuration and a fluid, but it would be recognized that the invention may have other configurations.

In a specific embodiment, the present invention provides a method for forming nanostructure composite using one or more nano material, e.g., nanoparticles, quantum dots, quantum wires, nano-columns, nanorods, nanotubes, quantum wells, nanoshells, nanobelts, nanoporous materials. The method includes providing a nanostructure material having a surface region (e.g., flat, textured, patterned) and one or more nano void regions within a first thickness in a surface region. In a specific embodiment, the nanostructure material can be an insulator, a conductor, or a semiconductor, including any combination of these and the like. In a specific embodiment, the insulator can be a glass, quartz, plastic, ceramic, or other type of homogeneous and/or composite and/or layered material. In a specific embodiment, the conductor can be a metal, a metal alloy, or any combination of these, and the like. Alternatively, the substrate member can be a semiconductor material, such as silicon, silicon-germanium alloys, Group III/V, or Group II/VI materials, and the like. Of course, there can be other variations, modifications, and alternatives. The method includes subjecting the surface region of the nanostructure material with a fluid. The method includes applying an external energy to the fluid and/or the nanostructure material to drive in a portion of the fluid into one or more of the nano void regions and cause the one or more nano void regions to be substantially filled with the fluid and free from air gaps. In a specific embodiment, the fluid is a liquid, which is substantially free from air gaps and the like.

In an alternative embodiment, a method for forming a nanostructure composite using one or more nano material is provided. The method includes providing a nanostructure material having one or more nano void regions. The method includes maintaining the nanostructure material in a vacuum environment and subjecting the one or more nano void regions with a fluid to while the nanostructure material is maintained in the vacuum environment. The one or more nano void regions are substantially filled with the fluid free from air gaps.

In an alternative specific embodiment a method of forming composite nanostructures using one or more nano materials (e.g., nanoparticles, quantum dots, quantum wires, nano-columns, nanorods, nanotubes, quantum wells, nanoshells, nanobelts, nanoporous materials) is provided. The method includes providing a nanostructure material having a surface region and one or more nano void regions within a thickness in a surface region. The method includes subjecting the surface region with a fluid and maintaining the nanostructure material including the fluid at a first temperature. In a specific embodiment, the first temperature is lower than at least a freezing temperature of the fluid. The method includes providing the nanostructure material including the fluid in a vacuum environment while maintaining the nanostructure material at the first temperature. The method increases the temperature of the nanostructure material from a first temperature to a second temperature to cause the one or more nano void regions to be filled with the fluid free from air gaps.

Depending upon the specific embodiment, one or more benefits may be achieved. The present technique provides an easy to use processes that relies upon conventional technology that is nanotechnology based. Additionally, the method provides a process that is compatible with conventional process technology without substantial modifications to conventional equipment and processes. In a specific embodiment, the present method and structure can also be provided using large scale manufacturing techniques, which reduce costs associated with the manufacture of the composite nanostructures. In a specific embodiment, the present method and structure can be provided using solution based processing. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings.

DETAILED DESCRIPTION OF THE INVENTION

According to the present invention, techniques related to nanostructure materials are provided. More particularly, the present invention provides a method and structure for forming nanostructure composite using a nanostructure material having one or more nano void region. Merely by way of example, the present method and structure have been implemented using a nanostructured morphology, but it would be recognized that the invention may have other morphologies.

Further details of the embodiments of the present invention can be found throughout the present specification and more particularly below.

Figure 1:
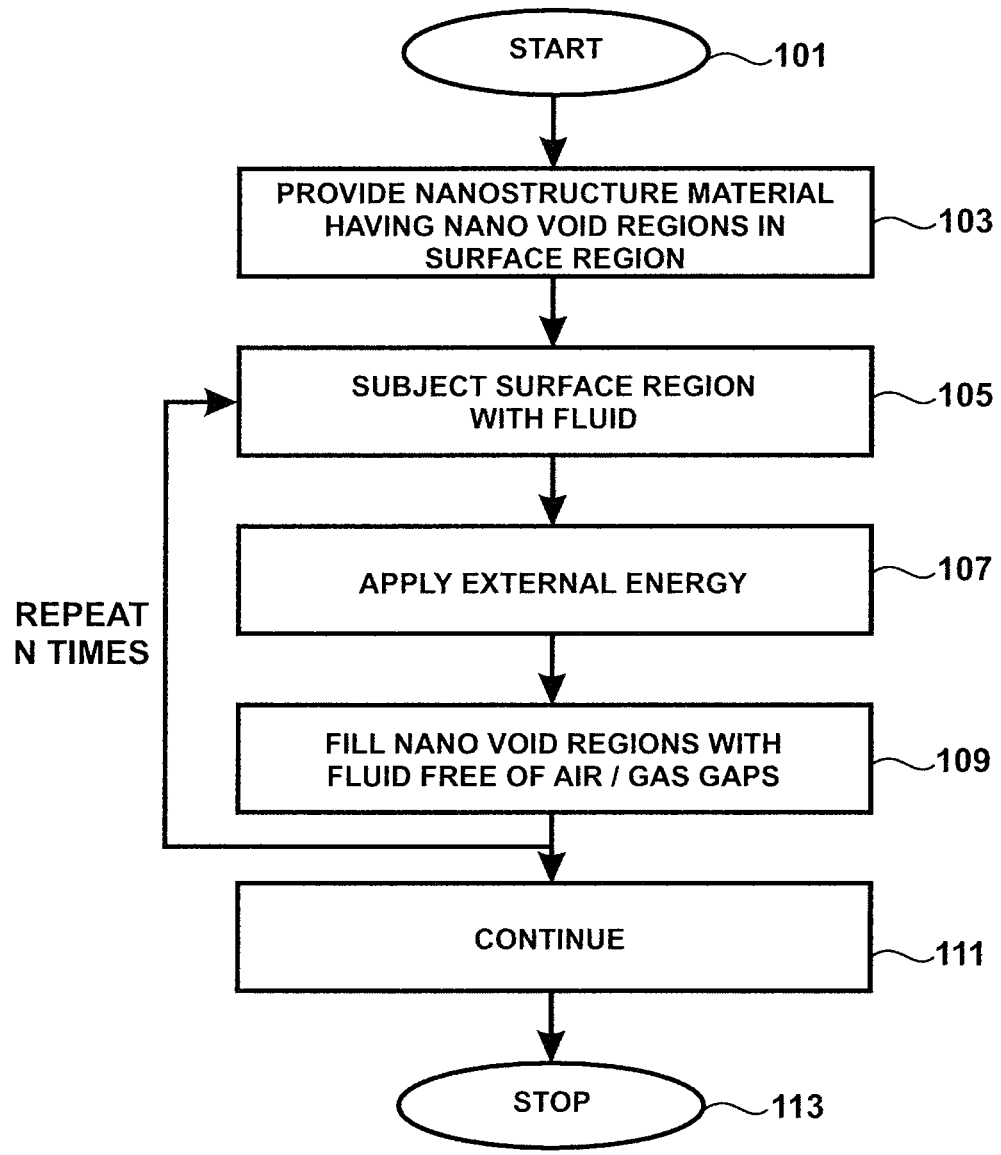
FIG. 1 is a simplified flow diagram illustrating a method of forming a nanostructure composite according to an embodiment of the present invention.

FIG. 1 is a simplified flow diagram illustrating a method 100 of forming a composite nano structure according to an embodiment of the present invention, which can be outlined below:

Start (Step 101);

Provide a nanostructure material (Step 103) having a surface region and one or more nano void regions. The nanostructure material can be a semiconductor material;

Subject a surface region of the nanostructure material to a fluid (Step 105);

Apply (Step 107) an external energy to the nanostructure and/or the fluid. For example, the external energy can be provided by a process selected from at least thermal, electrical, optical, electro-chemical, mechanical, pressure, gravitational, vacuum, or any one or more of these;

Substantially fill (Step 109) the one or more nano void regions with the fluid. In a specific embodiment, the one or more nanovoid regions including the fluid are free of air gaps;

Continue with other steps (Step 111); and

Stop (step 113).

The above sequence of steps illustrates a method of forming nanostructure composite according to an embodiment of the present invention. As shown, the method includes a combination of steps including a way of forming nanostructure composites. The method includes steps of using an external energy to fill one or more nano void regions in a nanostructure material. Depending on the embodiment, one or more steps may be added, one or more steps may be remove, or one or more steps are provided in a different sequence without departing from the scope of the claims herein. Further details of the present method can be found throughout the present specification and more particularly below.

Figure 2:
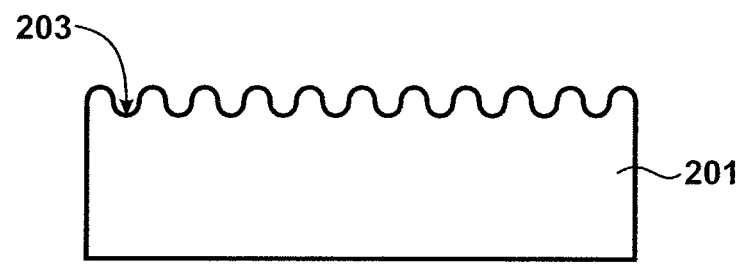
FIGS. 2-4 are simplified diagrams illustrating a method of forming a nanostructure composite according to an embodiment of the present invention.
Figure 3:
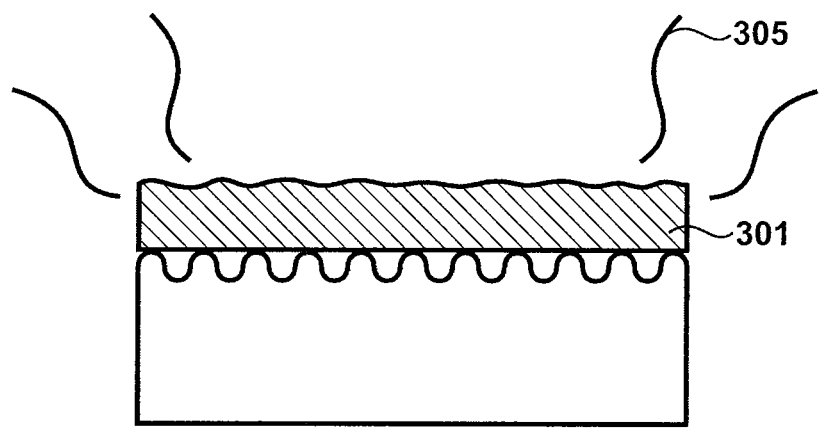
Figure 4:
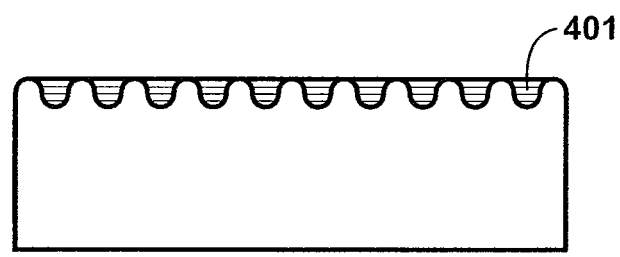

FIGS. 2-4 are a simplified diagrams illustrating a method of forming nanostructure composite according to an embodiment of the present embodiment. As shown in FIG. 2, a nanostructure material 201 is provided. The nanostructure material can be a nanoporous material in a specific embodiment. In alternative embodiments, the material can be nanoparticles, quantum dots, quantum wires, nano-columns, nanorods, nanotubes, quantum wells, nanoshells, nanobelts, or other combinations of nanoporous materials. Of course, there can be other variations, modifications, and alternatives.

In a specific embodiment, the nanostructure material can be an insulator, a conductor, or a semiconductor, including any combination of these and the like. In a specific embodiment, the insulator can be a glass, quartz, plastic, ceramic, or other type of homogeneous and/or composite and/or layered material. In a specific embodiment, the conductor can be a metal, a metal alloy, or any combination of these, and the like. Alternatively, the substrate member can be a semiconductor material, such as silicon, silicon on insulator, silicon-germanium alloys, Group III/V (e.g., GaAs), or Group II/VI materials, zinc oxides (e.g., ZnO), and the like. Of course, there can be other variations, modifications, and alternatives. The nanostructure material can include a semiconductor material. The semiconductor material can be subjected to a pattern and etch process known in the art to form the one or more nano void regions in a surface region in a specific embodiment.

Referring to FIG. 3, the method includes subjecting surface region, including the one or more nano void regions of the nanostructure material to a fluid 301. In a specific embodiment, the fluid can include a colloid material suspended in a suitable liquid, a precursor material, among others. In a specific embodiment, the nanostructure material including the fluid is subjected to an external energy 305. For example, the external energy can be applied using processes such as thermal, optical, electrically, electro-chemical, mechanical, pressure, vacuum, gravitational, or any one or more of these in combination working in a parallel and/or serial manner. As merely an example, the nanostructure material including the fluid can be subjected to a vacuum. The vacuum removes trapped air/gas in the one or more nano void regions and allows the fluid to be driven into the one or more nano void regions. In a preferred embodiment, the one or more nano void regions are substantially filled with the fluid free of air gaps. Alternatively, the nano structure material can be maintained in a vacuum environment. The surface region including the one or more nano void regions is then subjected with the fluid. The vacuum environment removes trapped air/gas and allows the fluid to substantially fill the nano void regions free of air gaps. Of course there can be other modifications, variations, and alternatives.

In a specific embodiment, the fluid may be subjected to a heating process at a temperature ranging from room temperature to about a boiling temperature before subjecting the nanostructure material with the fluid. The heating process reduces a viscosity and/or surface tension of the fluid thereby facilitates the fluid to be driven into the one or more nano void regions of the nanostructure material. Alternatively, the nanostructure material may be subjected to a first heating process while maintaining in the vacuum to facilitate removal of the trapped air/gas. The heating process includes an increase of temperature of the nanostructure from a first temperature (for example, room temperature) to a boiling temperature of the fluid. The heating process also allows for a decrease of viscosity or surface tension of the fluid. Furthermore, the heating process can be applied after the nanostructure material has been subjected to the fluid. Of course one skilled in the art would recognize other modifications, variations, and alternatives.

Figure 5:
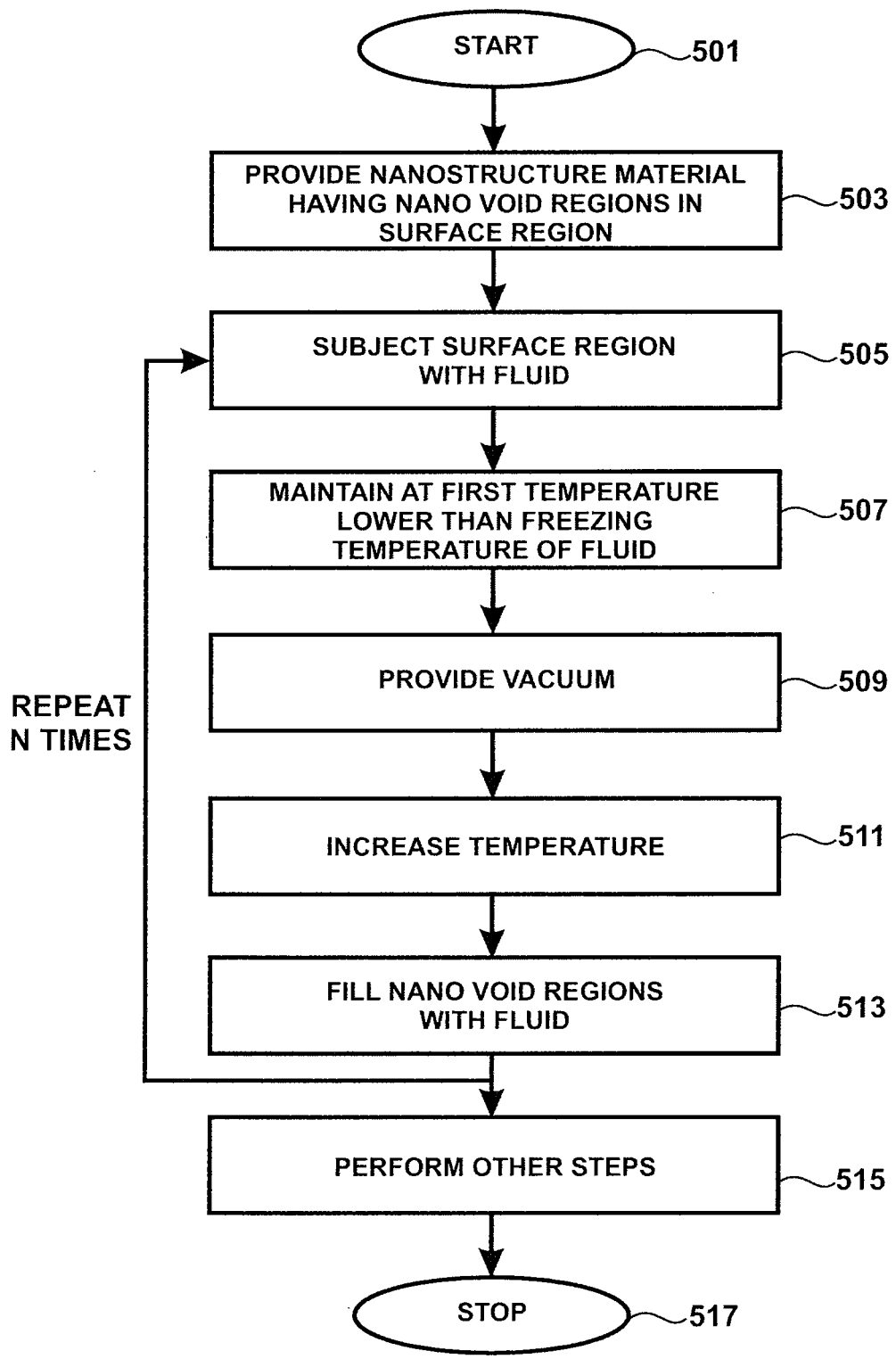
FIG. 5 is a simplified flow diagram illustrating an alternative method of forming a nanostructure composite according to an embodiment of the present invention.

FIG. 5 is a simplified process flow illustrating a method of forming nanostructure composite according to an embodiment of the present invention, which may be outline as follow:

Start (Step 501);

Provide a nanostructure material including one or more nano void regions within a thickness in a surface region (Step 503);

Subject the surface region of the nanostructure material with a fluid (Step 505);

Maintain the nanostructure material including the fluid at a first temperature lower than a freezing temperature of the fluid (Step 507);

Provide the nanostructure material including the fluid in a vacuum environment while maintaining the nanostructure material including the fluid at the first temperature (Step 509);

Increase the temperature of the nanostructure material including the fluid to a second temperature, the second temperature ranges from about room temperature to about boiling temperature of the fluid (Step 511);

Cause the one or more nano void regions to be filled with the fluid substantially free of air gaps; (Step 513);

Perform other steps (Step 515); and

End (Step 517).

The above sequence of steps illustrates a method of forming nanostructure composite according to an embodiment of the present invention. As shown, the method includes a combination of steps including a way of forming nanostructure composites. In a specific embodiment, the method includes steps of providing a nanostructure material including a fluid at a temperature below a freezing temperature of the fluid, subjecting the nanostructure material including the fluid to a vacuum, and increasing the temperature ranging from room temperature to boiling temperature of the fluid, to fill the one or more nano void regions in the nanostructure material. Depending on the embodiment, one or more steps may be added, one or more steps may be removed, or one or more steps are provided in a different sequence without departing from the scope of the claims herein. Further details of the present method can be found throughout the present specification and more particularly below.

Figure 6:
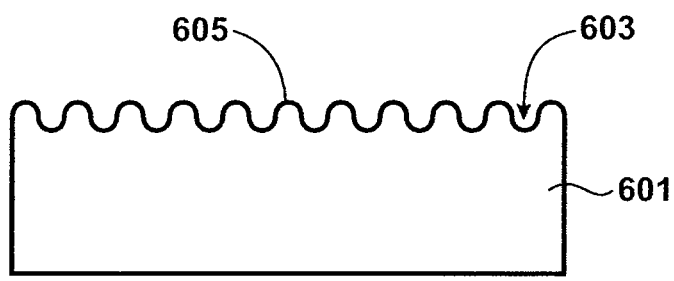
FIGS. 6-8 are simplified diagrams illustrating an alternative method of forming a nanostructure composite according to an embodiment of the present invention.
Figure 7:
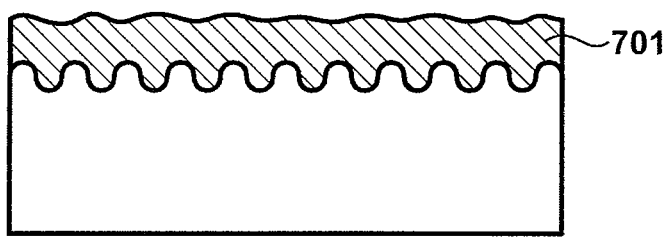
Figure 8:
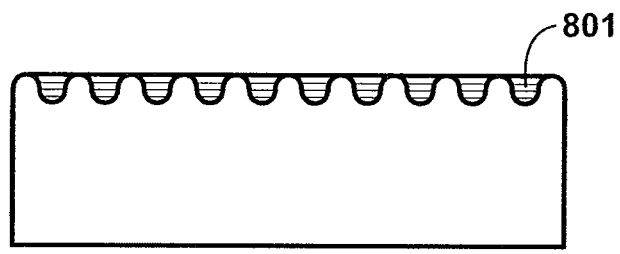

Referring to FIG. 6, a method of forming a nanostructure composite according to an embodiment of the present invention is illustrated. As shown, the method includes providing a nanostructure material 601 having a surface region. The nanostructure material includes one or more nano void regions 603 within a thickness of the surface region 605. In a specific embodiment, the nanostructure material can be a semiconductor material. The semiconductor material may be subjected to a pattern and etch process to provide for the one or more nano void regions in the thickness of the surface region in a specific embodiment. As shown in FIG. 7, the surface region of the nanostructure material is subjected with a fluid 701. The fluid can be a precursor material in certain embodiments. In a specific embodiment, the fluid may be a colloid material suspended in a suitable liquid. The nanostructure material including the fluid is maintained at a first temperature, the first temperature being provided at a temperature lower than at least a freezing temperature of the fluid. The method subjects the nanostructure material including the fluid to a vacuum while the nanostructure material including the fluid are maintained at the first temperature. In a preferred embodiment, the method includes increasing the temperature of the nanostructure material including the fluid to a temperature greater than at least the melting temperature of the fluid. Preferably, the fluid is driven into the one of more nano void regions to substantially fill the one or more nano void regions free of air gaps as shown in FIG. 8.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of forming composite nanostructures with one or more nanomaterial, the method comprising:

providing a nanostructure material having a surface region and one or more nano-void regions within a first thickness in the surface region;

applying a fluid over the surface region of the nanostructure material;

maintaining the fluid at a first temperature lower than the freezing temperature of the fluid; and subsequently applying an external energy to the fluid and/or the nanostructure material to drive in a portion of the fluid into one or more of the nano-void regions and cause the one or more nano-void regions to be substantially filled with the fluid and free from air gaps;

wherein the fluid comprises a precursor material.

2. The method of claim 1 wherein the precursor material is converted to a desired active material within the one or more nano-void regions at least by a process selected from thermal, electrical, optical, electro-chemical, mechanical, pressure, vacuum, or any one or more of these.

3. A method comprising:

providing a nanostructure material having one or more nano void regions;

exposing the nanostructure material to a fluid;

subjecting the fluid to a temperature below the melting point of the fluid; and after the fluid has been subjected to the temperature below the melting point of the fluid, providing a vacuum that forces the fluid to substantially fill the one or more nano void regions with the fluid, so that the nano-void regions are substantially free from air gaps.

4. The method of claim 3 wherein the fluid comprises a precursor material.

5. The method of claim 4 wherein the precursor material is converted to a desired active material within the one or more nano void regions at least by a process selected from thermal, electrical, optical, electro-chemical, mechanical, pressure, or vacuum.

6. The method of claim 4 wherein the precursor material comprises a colloid material suspended in a liquid.

7. A method of forming composite nanostructures with one or more nanomaterials comprising the following sequence of operations:
1) providing a nanostructure material having a surface region and one or more nano-void regions within a thickness of the nanostructure material;
2) applying a fluid to the surface region;
3) subjecting the nanostructure material including the fluid to a first temperature, the first temperature being lower than at least a freezing temperature of the fluid;
4) exposing the nanostructure material including the fluid to a vacuum environment while maintaining the nanostructure material at the first temperature;
5) increasing a temperature of the nanostructure material from the first temperature to a second temperature; and
6) driving the fluid into the one or more nano-void regions to substantially fill the one or more nano-void regions with the fluid free of air gap, wherein driving the fluid into the one or more nano-void regions is at least partially caused by the vacuum;

wherein the applying step is provided before the subjecting step.

8. The method of claim 7 wherein the fluid comprises a precursor material.

9. The method of claim 8 wherein the precursor material is converted to a solid material using a chemical process, an electrical process, an electrochemical process, a thermal process, a mechanical process, an optical process, or a combination thereof.

10. The method of claim 8 wherein the second temperature ranges from about room temperature to about a boiling temperature of the fluid.

* * * * *